(12) United States Patent
Mamdy

(10) Patent No.: US 11,621,363 B2
(45) Date of Patent: Apr. 4, 2023

(54) INTEGRATED CIRCUIT COMPRISING A SINGLE PHOTON-BASED AVALANCHE DIODE ARRAY AND METHOD FOR MANUFACTURING SUCH INTEGRATED CIRCUIT

(71) Applicant: STMicroelectronics (Crolles 2) SAS, Crolles (FR)

(72) Inventor: Bastien Mamdy, Saint Martin d'Heres (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 245 days.

(21) Appl. No.: 17/076,281

(22) Filed: Oct. 21, 2020

(65) Prior Publication Data
US 2021/0126149 A1   Apr. 29, 2021

(30) Foreign Application Priority Data
Oct. 28, 2019 (FR) ..................... 1912072

(51) Int. Cl.
*H01L 31/107* (2006.01)
*H01L 31/02* (2006.01)
(Continued)

(52) U.S. Cl.
CPC .... *H01L 31/1075* (2013.01); *H01L 31/02027* (2013.01); *H01L 31/02327* (2013.01); *H01L 31/18* (2013.01)

(58) Field of Classification Search
CPC .......... H01L 31/1075; H01L 31/02027; H01L 31/02327; H01L 31/18; H01L 31/107;
(Continued)

(56) References Cited

U.S. PATENT DOCUMENTS 7,667,400 B1 * 2/2010 Goushcha ........... H01L 31/1075
313/523
2014/0138785 A1 * 5/2014 Pralle ................ H01L 27/14645
257/432

(Continued)

FOREIGN PATENT DOCUMENTS

EP        3462497 A1    4/2019
JP     2018195908 A  * 12/2018    ........... G02B 5/1842
(Continued)

OTHER PUBLICATIONS

Purica et al., "Reflectivity analysis of the Bragg reflector based on periodic structures of different thin layers" 11th IEEE International Symposium on Electron Devices for Microwave and Optoelectronic Applications, 2003. EDMO 2003. (pp. 296-301) (Year: 2003).*

*Primary Examiner* — Sitaramarao S Yechuri
(74) *Attorney, Agent, or Firm* — Slater Matsil, LLP

(57) ABSTRACT

An integrated circuit is formed in a semiconductor substrate. An array of single-photon-avalanche diodes is formed at a front side of the semiconductor substrate. The array includes first and second diodes that are adjacent to each other. A Bragg mirror is positioned between the first and second diodes. The Bragg mirror is configured to prevent a propagation of light between the first and second diodes.

20 Claims, 3 Drawing Sheets

(51) Int. Cl.
*H01L 31/0232* (2014.01)
*H01L 31/18* (2006.01)

(58) Field of Classification Search
CPC ............. H01L 31/1804; H01L 27/1443; H01L 27/1446
See application file for complete search history.

(56) References Cited

U.S. PATENT DOCUMENTS

| | | | |
|---|---|---|---|
| 2015/0054111 A1* | 2/2015 | Niclass | H01L 27/1446 257/438 |
| 2018/0351023 A1* | 12/2018 | Shubin | H01L 31/02161 |
| 2019/0103433 A1 | 4/2019 | Yamashita | |
| 2019/0312070 A1* | 10/2019 | Piemonte | H01L 31/028 |

FOREIGN PATENT DOCUMENTS

| | | | | |
|---|---|---|---|---|
| RU | 2641620 C1 * | 1/2018 | ....... | H01L 31/02161 |
| WO | 2019155875 A1 | 8/2019 | | |

\* cited by examiner

INTEGRATED CIRCUIT COMPRISING A SINGLE PHOTON-BASED AVALANCHE DIODE ARRAY AND METHOD FOR MANUFACTURING SUCH INTEGRATED CIRCUIT

CROSS-REFERENCE TO RELATED APPLICATIONS

This application claims the benefit of French Patent Application No. 1912072, filed on Oct. 28, 2019, which application is hereby incorporated herein by reference.

TECHNICAL FIELD

Embodiments relate to an array of single-photon-avalanche diodes and a process for making the same.

BACKGROUND

Single-photon-avalanche diodes are generally referred to as SPADs by those skilled in the art. SPADs are capable of detecting signals of low intensity such as a single photon, and of signaling the time of arrival of this photon with a high temporal resolution.

In particular, SPADs exploit the avalanche current of a p-n junction, which current is triggered by an incident ray. More particularly, SPADs are reverse biased beyond their breakdown voltage.

A high reverse bias voltage generates a sufficiently high electric field for a single charge carrier introduced into a depletion region of the SPAD to be able to cause an avalanche that is self-sustained via one ionization per impact.

The avalanche is then extinguished, actively or passively, in order to allow the SPAD to be reset in order to detect other photons.

The initiating charge carrier may be generated photoelectrically by a single incident photon striking the region of high field. This operating mode for detection of a single-photon is often called the Geiger mode.

During the avalanche in a SPAD, a high number of hot carriers are generated. These hot carriers relax by emitting parasitic light in the red or in the near infrared in all directions.

In conventional SPAD arrays, the light emitted by the hot carriers generated in a SPAD of the array may propagate through large thicknesses of silicon separating the SPADs and be absorbed by an adjacent SPAD.

This absorption of parasitic light by the adjacent SPAD then generates an undesirable avalanche in this SPAD. This effect is called electro-optical crosstalk.

The avalanche in the adjacent SPAD resulting from the crosstalk may cause a drop in voltage below the breakdown voltage. Therefore, this adjacent SPAD is no longer able to detect photons. It is then necessary to recharge this adjacent SPAD so as to increase the bias voltage above the breakdown voltage in order for the SPAD to be able once again to detect photons.

This recharge requires a substantial length of time, several nanoseconds, during which the SPAD cannot detect photons.

This recharge resulting from an undesired communication of light emitted by the hot carriers generated by the adjacent SPAD therefore decreases the performance of the SPAD array.

In order to attenuate crosstalk, it is conventional to decrease the excess bias voltage of the SPADs. Specifically, decreasing the excess bias voltage allows the number of hot carriers generated during the avalanche to be decreased. Nevertheless, this solution leads to a decrease in the performance of the SPADs of the SPAD array.

SUMMARY

Modes of implementation and embodiments of the invention relate to integrated circuits, in particular examples, to those comprising an array of single-photon-avalanche diodes.

Embodiments can provide an integrated circuit comprising a high-performance SPAD array allowing crosstalk to be decreased or even eliminated.

According to one aspect, an integrated circuit is provided. The integrated circuit comprises a semiconductor substrate incorporating an array of single-photon-avalanche diodes comprising at least two diodes that are adjacent to each other. At least one Bragg mirror is positioned between the at least two adjacent diodes, respectively. The Bragg mirror is suitable for preventing a propagation of light between these two diodes.

Below, the SPAD array is also called the photodetector array. The photodetector array therefore comprises a plurality of SPADs.

An integrated circuit according to this aspect may comprise one or more Bragg mirrors. Each Bragg mirror thus has a first lateral side making contact with a first SPAD of the photodetector array and a second lateral side, opposite the first lateral side, making contact with a second SPAD of the photodetector array, which SPAD is adjacent to the first SPAD.

Crosstalk between two adjacent SPADs between which a Bragg mirror is positioned is thus able to be eliminated in an integrated circuit according to this aspect. Specifically, when a SPAD placed on one side of a Bragg mirror receives a photon, this Bragg mirror allows the incident parasitic light emitted by the hot carriers generated during an avalanche in this receiver SPAD to be reflected and/or absorbed.

Thus, the parasitic light is not transmitted to the adjacent SPAD placed on the other side of the Bragg mirror. These two SPADs may thus operate at the same time and do not run the risk of being deactivated by parasitic light generated by one of these SPADs.

Furthermore, positioning a Bragg mirror between the SPADs makes it possible to continue to employ a high excess bias voltage. Specifically, the number of hot carriers generated during the avalanche no longer has any impact on the adjacent SPADs. It is thus therefore possible to design and fabricate a high-performance photodetector array.

According to one embodiment, each Bragg mirror is configured to prevent a propagation of light having a wavelength among the wavelengths capable of being generated by an energetic relaxation of hot carriers generated by an avalanche effect triggered in one of the two respective diodes.

By way of indication, such wavelengths may be comprised between 500 nm and 2 µm, for example.

Preferably, the integrated circuit comprises a Bragg mirror positioned between each adjacent diode of the photodetector array.

Thus, such an integrated circuit is suitable for eliminating crosstalk throughout the photodetector array. All the SPADs of the array may therefore operate at the same time and do not run the risk of being deactivated by parasitic light originating from adjacent SPADs.

Preferably, according to one embodiment, each Bragg mirror comprises a plurality of layers and is suitable for reflecting light having an angle of incidence comprised between 0° and 90° on the Bragg mirror, with respect to an axis orthogonal to each layer of material of the Bragg mirror.

Such a Bragg mirror is then suitable for preventing the diffusion of the most detrimental photons. Specifically, the risk of crosstalk is highest for photons having an angle of incidence comprised between 0° and 90°.

According to one embodiment, the semiconductor substrate has a front side, each Bragg mirror comprising at least three alternate layers of at least two materials of different refractive indices, at least two of the layers extending depthwise into the substrate from the front side down to a bottom insulating region defining the bottom of each diode and electrically insulating each diode from the rest of the substrate.

Thus, each diode has a height defined between the front side of the substrate, which side is intended to be exposed to a light signal to be detected, and a back side of the substrate, which makes contact with the insulating region.

According to one embodiment, at least one of the layers extends depthwise from the front side down to a far end located between the front side and the bottom insulating region.

In particular, each of these layers extends depthwise over a sufficient length to be able to reflect light having an angle of incidence smaller than Brewster's angle.

Advantageously, according to one embodiment, the at least two materials of different refractive indices comprise silicon and silicon dioxide.

These materials possess refractive indices allowing the use of layers of small thickness while being propitious to the reflection of the light able to be generated by an energetic relaxation of hot carriers generated by an avalanche effect triggered in one of the two respective diodes. Furthermore, silicon and silicon dioxide are materials that have been mastered by those skilled in the art and that are inexpensive. Thus, the fabrication of a Bragg mirror with such materials is advantageous.

According to one embodiment, the integrated circuit furthermore comprises lateral deep trench isolations, the layers of silicon dioxide and the lateral deep trench isolations having the same depth and the same structure.

According to another aspect, an electronic device is provided, the electronic device comprising an integrated circuit such as defined above.

According to another aspect, a process for fabricating an integrated circuit is provided. An array comprising at least two diodes that are adjacent to one another is formed within a semiconductor substrate. The diodes are single-photon-avalanche-diodes. At least one Bragg mirror is formed between the at least two diodes that are adjacent to each other of the array, The Bragg mirror is suitable for preventing a propagation of light between these two diodes.

According to one mode of implementation, the at least one Bragg mirror is formed so that it is able to reflect light having a length among the wavelengths capable of being generated by an energetic relaxation of hot carriers generated by an avalanche effect triggered in one of the two respective diodes.

According to one mode of implementation, the at least one Bragg mirror is formed so that it is suitable for reflecting light having an angle of incidence comprised between 0° and 90° on the Bragg mirror.

According to one mode of implementation, the formation of the diodes of the array comprises forming a bottom insulating region defining the bottom of each diode and electrically insulating each diode from the rest of the substrate.

Furthermore, according to one mode of implementation, the formation of each Bragg mirror comprises forming at least three alternate layers of at least two materials of different refractive indices between the two adjacent diodes so that at least two of the layers extend depthwise into the substrate from a front side of the substrate down to the bottom insulating region.

According to one mode of implementation, the formation of the at least one Bragg mirror comprises forming an initial volume of a first material between two adjacent diodes. The first material has a first refractive index. A plurality of trenches are etched into the volume of the first material. Each trench is filled with a second material having a second refractive index different from the first refractive index in order to form layers of second material. Each volume of first material is located between two layers of second material forming a layer of first material.

Thus, the Bragg mirror comprises layers alternating between layers of the first material and layers formed by filling the trenches with at least one other material.

Such a process for fabricating the Bragg mirror allows a single-crystal first material to be preserved. Specifically, each layer of the first material is obtained from the initial volume of the first material.

According to this latter mode of implementation, at least one of the trenches filled with second material extends depthwise from the front side down to a far end located between the front side and the bottom insulating region.

Such a trench may be formed easily and rapidly because it is not necessary to etch the volume of the first material over the entire height of the diode.

As a variant, according to another mode of implementation, the formation of at least one Bragg mirror comprises forming an initial volume of a first material between two adjacent diodes, the first material having a first refractive index, etching a trench into this first material, the trench having two lateral edges delineated by the first material then forming at least one alternation of a layer of a second material having a second refractive index different from the first refractive index, and of a layer of the first material, successively from the lateral edges of the trench until the trench is filled.

Such a process for fabricating the Bragg mirror has the advantage of etching one and only one trench into the first material.

According to one mode of implementation, the first material and the second material are chosen from silicon and silicon dioxide.

According to one mode of implementation, the fabricating process furthermore comprises forming lateral deep trench isolations comprising silicon dioxide, and the formation of the layers of silicon dioxide is implemented simultaneously with the formation of the lateral deep trench isolations.

BRIEF DESCRIPTION OF THE DRAWINGS

Other advantages and features of the invention will become apparent on examining the detailed description of completely non-limiting modes of implementation and embodiments and the appended drawings, in which.

DETAILED DESCRIPTION OF ILLUSTRATIVE EMBODIMENTS

Figure 1:
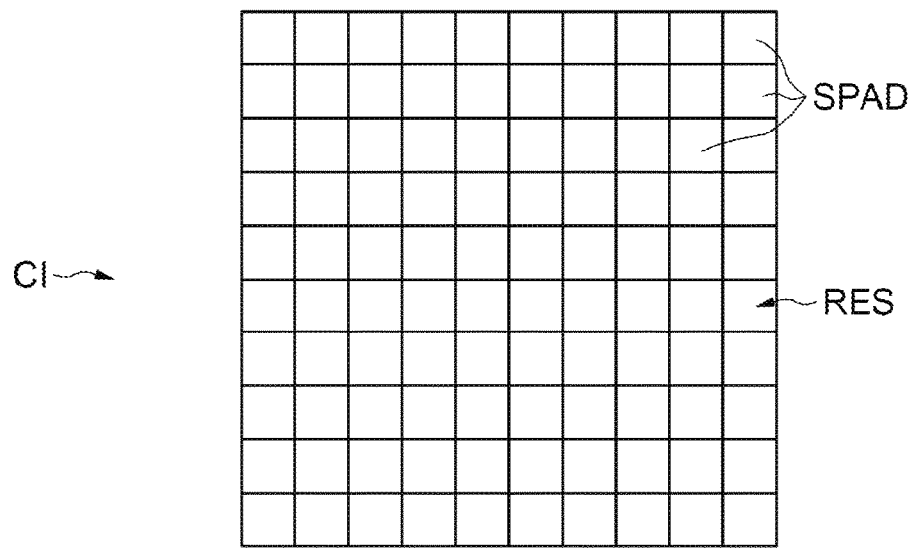
FIG. 1 is a schematic representation of a top view of an integrated circuit according to one embodiment of the invention.

FIG. 1 shows one embodiment of an integrated circuit CI according to the invention. The integrated circuit CI comprises a photodetector array RES. The photodetector array RES comprises a plurality of single-photon-avalanche diodes, i.e. what are called SPADs. In the embodiments shown in FIGS. 2 and 3, only two diodes $SPAM_1$, $SPAD_2$ have been shown. Preferably, all of the SPADs of the photodetector array RES are identical. In particular, each SPAD has a parallelogram shape. Preferably, the photodetector array RES lies in a plane.

The SPADs allow light to be detected. In particular, the SPADs exploit the avalanche current of a p-n junction triggered by an incident photon to detect this photon.

Figure 2:
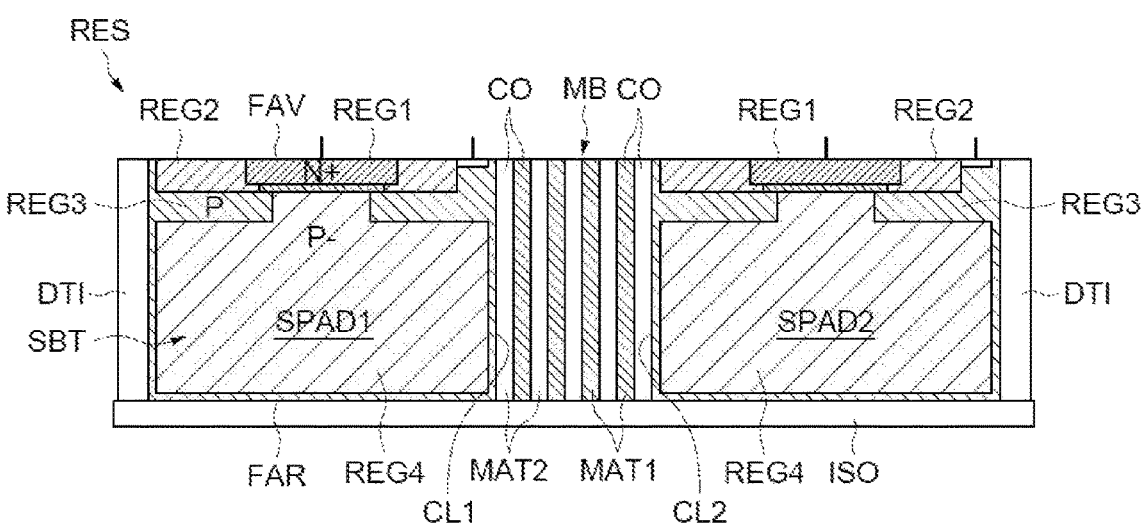
FIG. 2 is a schematic representation of a partial cross section through an integrated circuit according to a first embodiment of the invention.
Figure 3:
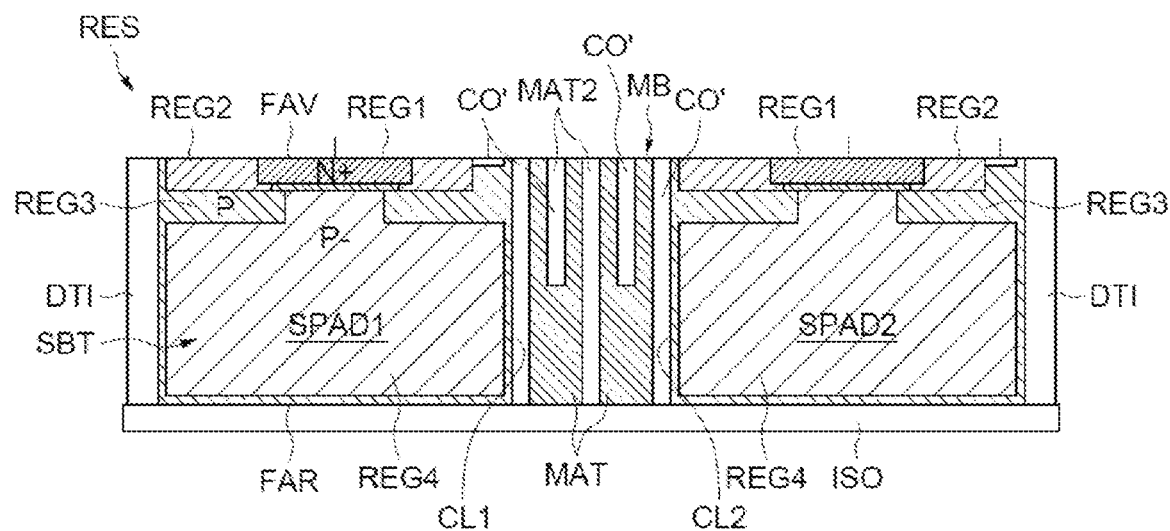
FIG. 3 is a schematic representation of a partial cross section through an integrated circuit according to a second embodiment of the invention.

In particular, in the embodiments shown in FIGS. 2 and 3, each SPAD is formed in a semiconductor substrate SBT. Each SPAD comprises a first region $REG_1$. of the SPAD. This first region $REG_1$. is of a first conductivity type, for example n+-type. This first region $REG_1$. is designed to capture photons incident on this portion of a side, called the front side FAV, of the semiconductor substrate SBT. This front side FAV in particular bounds the first region $REG_1$.

The front side FAV of the semiconductor substrate SBT bears components of the integrated circuit. In particular, the front side FAV is the side on which the region of the integrated circuit containing the electronic elements of the integrated circuit, such as transistors and diodes, is fabricated. This region is also referred to by the conventional acronym "FEOL" for "Front End Of Line". The light signal to be detected by the array may be received either via the front side FAV or via a back side FAR of the substrate SBT, which side is opposite the front side FAV.

The first region $REG_1$ is connected to a cathode contact.

Each SPAD furthermore comprises a second region $REG_2$ of a second conductivity type, for example p--type. This second region $REG_2$ laterally frames the first region $REG_1$.

Each SPAD also comprises a third region $REG_3$ of a third conductivity type, for example of p-type, connected to an anode contact. This third region $REG_3$ in particular extends under the first region $REG_1$ and the second region $REG_2$.

Each SPAD furthermore comprises a deep region $REG_4$ of the second conductivity type, for example p--type. This deep region $REG_4$ is surrounded by the third region $REG_3$.

This deep region $REG_4$ rests on a bottom insulating region ISO that extends under all of the SPADs of the photodetector array RES. Thus, each diode has a height suitable for capturing photons that is defined between the front side FAV of the substrate SBT and the back side FAR of the substrate SBT, which makes contact with the bottom insulating region ISO.

Each SPAD is reverse biased. For example, the first region of $REG_1$ of n+-type is raised to 20 V and the third region $REG_3$ of p-type is kept at 0 V. In particular, each SPAD is the reversed biased beyond its breakdown voltage.

A high reverse bias voltage generates a sufficiently high electric field for a single charge carrier introduced into a depletion region of the SPAD to be able to cause an avalanche that is self-sustained via one ionization per impact.

During the avalanche in a SPAD, a high number of hot carriers are generated. These hot carriers relax by emitting parasitic light in the red or in the near infrared in all directions.

In order to avoid electro-optical crosstalk between the SPADs of the array, the photodetector array RES also comprises a Bragg mirror MB between each SPAD of the photodetector array RES. Specifically, each Bragg mirror MB allows the parasitic light generated by a receiver SPAD to be reflected and/or absorbed so as to prevent this parasitic light from being communicated to a SPAD adjacent to this receiver SPAD.

FIGS. 2 and 3 show two embodiments that include a Bragg mirror MB between two diodes $SPAD_1$ and $SPAD_2$. In these two embodiments, the Bragg mirror MB comprises a succession of at least two layers CO of materials $MAT_1$, $MAT_2$ of different refractive indices. This succession of layers CO allows the light incident on the Bragg mirror MB to be reflected and/or absorbed.

In particular, the layers CO are oriented so as to extend vertically, i.e. orthogonally with respect to the front side FAV of the substrate SBT. Furthermore, the refractive index of a layer CO of the Bragg mirror MB is different from that of the adjacent layers CO.

Each Bragg mirror MB thus has a first lateral side $CL_1$ making contact with a first diode SPAM of the photodetector array RES and a second lateral side $CL_2$, opposite the first lateral side $CL_1$, making contact with a second diode $SPAD_2$ of the photodetector array RES, which diode is adjacent to the first diode $SPAD_1$.

More particularly, the Bragg mirror MB may then comprise an alternate succession of layers CO of silicon and of layers CO of silicon dioxide, silicon and silicon dioxide having different refractive indices. These materials possess refractive indices allowing the use of layers CO of small thickness while being propitious to the reflection of the light able to be generated by an energetic relaxation of hot carriers generated by an avalanche effect triggered in one of the two respective diodes. Furthermore, silicon and silicon dioxide are materials that are mastered and commonplace in semiconductor devices. Thus, the fabrication of a Bragg mirror MB with such materials is relatively simple to implement and advantageous, in particular in terms of cost savings.

The greater the number of layers CO that the Bragg mirror MB comprises, the higher its performance with respect to prevention of a diffusion of photons between the two diodes $SPAD_1$, $SPAD_2$ between which the Bragg mirror is positioned. In the embodiments shown in FIGS. 2 and 3, the Bragg mirror MB comprises five layers CO of silicon dioxide and four layers CO of silicon.

The thickness of each layer may be chosen using the following Bragg relationship:

$$L = \lambda o / 4\, n,$$

where λo is the wavelength of interest and n is the refractive index of the layer.

In particular, the wavelength of interest may be calculated using the following formula:

$$\lambda_0 = \frac{\lambda_{max} - \lambda_{min}}{\lambda_{max} \times \lambda_{min}} \quad \text{[Equation 1]}$$

In order to reflect parasitic light able to cause an avalanche in a SPAD adjacent to a SPAD that receives a photon, λmin may be chosen to be between 500 nm and 600 nm (red) and λmax may be chosen to be between 1.1 µm and 1.2 µm (near infrared). Thus, λo may be equal to 824 nm. The thickness of the layers of silicon dioxide may then be equal to 142 nm and the thickness of the layers of silicon may be 56 nm.

Each Bragg mirror MB of the photodetector array RES is at least suitable for reflecting light having an angle of incidence comprised between 0° and 60° on the Bragg mirror MB. Each Bragg mirror MB is then suitable for preventing the diffusion of the most detrimental photons. Specifically, the risk of crosstalk is highest for photons having an angle of incidence comprised between 0° and 60°.

In the embodiment described above with reference to FIG. 2, each of the layers CO extends over the height of the diodes between which the Bragg mirror MB is positioned. Each layer CO therefore extends from the front side FAV of the substrate SBT to the bottom insulating region ISO.

As a variant, as shown in FIG. 3, certain layers CO' of the Bragg mirror MB may extend only over a fraction of the height of the diodes between which the Bragg mirror MB is positioned. In particular, in the embodiment shown in FIG. 3, two layers CO' of silicon dioxide extend only over a fraction of the height of the diodes. In particular, each layer CO' extending only over one portion of the height of the diodes extends depthwise from the front side FAV down to a far end located between the front side FAV and the bottom insulating region ISO.

Each layer CO' extending only over one portion of the height of the SPADs is suitable for preventing the diffusion of light having a small angle of incidence between the diodes, and in particular an angle of incidence comprised between 0° and Brewster's angle.

An integrated circuit CI according to the invention is thus suitable for eliminating crosstalk between two adjacent SPADs between which a Bragg mirror MB is positioned.

When an SPAD placed on one side $CL_1$, $CL_2$ of a Bragg mirror MB receives a photon, this Bragg mirror MB allows the incident parasitic light emitted by the hot carriers generated during an avalanche in this receiver SPAD to be reflected and/or absorbed.

Thus, the parasitic light is not transmitted to the adjacent SPAD placed on the other side $CL_1$, $CL_2$ of the Bragg mirror MB. Thus, these two SPADs may operate at the same time and do not run the risk of being deactivated by parasitic light generated by one of these SPADs.

Furthermore, positioning a Bragg mirror MB between the SPADs makes it possible to continue to employ a high excess bias voltage. Specifically, the number of hot carriers generated during the avalanche no longer has any impact on the adjacent SPADs. It is thus therefore possible to design a high-performance photodetector array RES.

Moreover, the integrated circuit may comprise lateral deep trench isolations DTI as shown in FIGS. 2 and 3. Deep trench isolations are well-known to those skilled in the art, who refer to them by the acronym "DTI".

Figure 4:
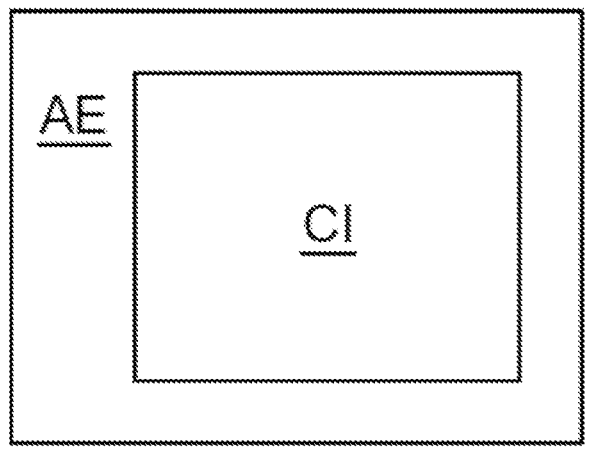
FIG. 4 is a schematic representation of an electronic device according to one embodiment of the invention.

FIG. 4 shows an electronic device AE comprising an integrated circuit CI according to the invention. The electronic device AE may be a time-of-flight sensor or a device equipped with a time-of-flight sensor.

Figure 5:
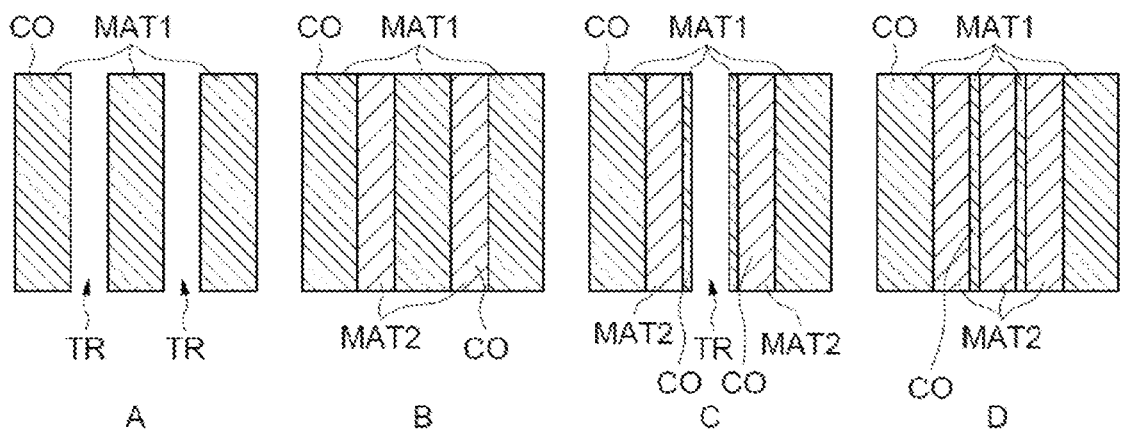
FIG. 5 illustrates the results of steps of a process for fabricating an integrated circuit according to a first mode of implementation of the invention.

FIG. 5 illustrates the results of steps of a process for fabricating an integrated circuit according to a first mode of implementation.

Figure 6:
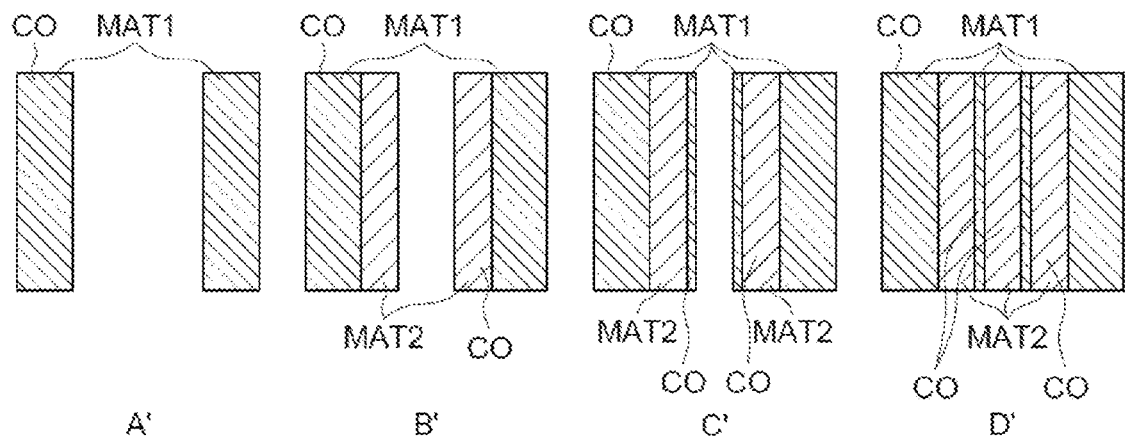
FIG. 6 illustrates the results of steps of a process for fabricating an integrated circuit according to a second mode of implementation of the invention.

FIG. 6 illustrates the results of steps of a process for fabricating an integrated circuit according to a second mode of implementation.

These two modes of implementation firstly comprise forming a plurality of SPADs that are adjacent to one another so as to form a photodetector array. In particular, an initial volume of a first material $MAT_1$, for example of silicon, is also formed between each adjacent diode of the array.

Each initial volume of the first material $MAT_1$ extends against the SPADs adjacent to this initial volume over a height equal to that of the adjacent SPADs. Each Bragg mirror is then formed from this volume of silicon.

FIGS. 5 and 6 thus illustrate two modes of implementation for fabricating a Bragg mirror from a volume of the first material $MAT_1$ between two adjacent diodes of the photodetector array.

The mode of implementation shown in FIG. 5 comprises a step A in which a plurality of trenches TR are etched into the first material $MAT_1$. In this mode of implementation, the first material $MAT_1$ is silicon. In particular, in FIG. 5 only two trenches TR have been illustrated. Nevertheless, it is possible to etch, in step A, more than two trenches TR.

Layers CO of a second material $MAT_2$ are then formed in the trenches TR produced in step B. This second material $MAT_2$ has a refractive index different from that of the first material $MAT_1$. In particular, the second material $MAT_2$ may be silicon dioxide. These layers of second material $MAT_2$ are formed so as to fill each of these trenches TR.

In step C, another trench TR is then etched into the volume of the first material $MAT_1$ between the layers of second material $MAT_2$. Next, in step D, another layer of the second material $MAT_2$ is formed in the trench TR produced in step C. This layer of second material $MAT_2$ is formed so as to fill the trench TR produced in step C.

Each trench TR etch is therefore used to form a layer of second material $MAT_2$. The layers of first material $MAT_1$ are formed between the layers of second material $MAT_2$ from the initial volume of the first material $MAT_1$.

Thus, the width of the trenches TR is chosen depending on the thickness desired for the layers of second material $MAT_2$. In particular, the width of each trench TR is 142 nm when the second material $MAT_2$ is silicon dioxide. The arrangement of the trenches TR is chosen so as to form layers of first material $MAT_1$ of 56 nm thickness when the first material $MAT_1$ is silicon.

The trenches TR are produced in two different steps (steps A and C) so as to avoid forming fragile layers CO of first material $MAT_1$ of small thickness between the trenches TR before these trenches TR are filled with the second material $MAT_2$. In this mode of implementation, the layers of first material $MAT_1$ are all formed from the initial volume of the first material $MAT_1$.

Thus, such a process for fabricating the Bragg mirror may allow single-crystal layers of first material $MAT_1$, and in particular single-crystal layers of silicon, to be preserved. Furthermore, in this mode of implementation, the formation of the layers of silicon dioxide may be implemented simultaneously with a formation of lateral deep trench isolations. Specifically, the layers of silicon dioxide and the lateral deep trench isolations have the same structure and may therefore be formed in the same fabricating step.

As a variant, the mode of implementation shown in FIG. 6 comprises, in step A', forming by etching a trench TR of sufficient width to contain a plurality of layers CO, and in particular all of the layers, of the Bragg mirror. In particular, the layers CO of material $MAT_1$, $MAT_2$ of the Bragg mirror are formed successively in the trench TR from the lateral edges of this trench TR until the trench TR is filled. For example, layers of silicon $MAT_1$ and layers of silicon dioxide $MAT_2$ are successively formed in the trench TR.

More particularly, in the example shown in FIG. 6, a trench TR of 538 nm is etched into an initial volume of silicon. This width allows three layers of silicon dioxide $MAT_2$ of 142 nm and two layers of silicon $MAT_1$ of 56 nm to be received. In particular, in step B', two layers of silicon dioxide $MAT_2$ of 142 nm are formed on each lateral edge of the trench TR in contact with the silicon of the initial volume of silicon.

Next, in step C', two layers of silicon $MAT_1$ of 56 nm are formed against the layers of silicon dioxide formed in step B'. Lastly, in step D', a layer of silicon dioxide $MAT_2$ of 142 nm is formed between the layers of silicon formed in step C'.

Such a process for fabricating the Bragg mirror has the advantage of etching one and only one trench TR in the first material $MAT_1$. Specifically, etching a plurality of trenches TR in the first material $MAT_1$ weakens the latter.

In the two modes of implementation shown in FIGS. 5 and 6, the depth of the etched features may be chosen depending on the height desired for the layers of the Bragg mirror, for example for the layers of silicon dioxide. Thus, the etched features may be formed over the height of the SPADs or over one portion of the height of the SPADs.

In particular, layers CO' of silicon dioxide extending only over one portion of the height of the SPADs may be formed easily and rapidly. Specifically, for such layers of silicon dioxide, it is not necessary to etch the volume of the first material $MAT_1$ over the entire height of the diode and the formation of each layer of silicon dioxide is faster because of the smaller height of this layer.

Of course, various variants of and modifications to the present invention will appear obvious to those skilled in the art. For example, nothing would prevent a Bragg mirror comprising an alternation of layers of silicon nitride and of germanium from being used instead of a mirror comprising an alternation of layers of silicon and of silicon dioxide.

What is claimed is:

1. An integrated circuit comprising:
    a semiconductor substrate;
    an array of single-photon-avalanche diodes formed at a front side of the semiconductor substrate, the array including first and second diodes that are adjacent to each other; and
    a Bragg mirror positioned between the first and second diodes, the Bragg mirror configured to prevent a propagation of light between the first and second diodes, wherein each Bragg mirror (MB) comprises at least three alternate layers of at least two materials of different refractive indices, at least two of the layers extending depthwise into the substrate (SBT) from the front side down to a bottom insulating region that defines a bottom of each diode, the bottom insulating region electrically insulating each diode from the rest of the substrate, wherein at least one of the layers extends depthwise from the front side down to a far end located between the front side and the bottom insulating region.

2. The integrated circuit according to claim 1, wherein each Bragg mirror is configured to prevent the propagation of light having a wavelength among the wavelengths capable of being generated by an energetic relaxation of hot carriers generated by an avalanche effect triggered in the first or second diode.

3. The integrated circuit according to claim 1, wherein each Bragg mirror (MB) comprises a plurality of layers and is configured to reflect light having an angle of incidence between 0° and 90° on the Bragg mirror, with respect to an axis orthogonal to each layer of material of the Bragg mirror.

4. The integrated circuit according to claim 1, wherein the at least two materials of different refractive indices comprise silicon and silicon dioxide.

5. The integrated circuit according to claim 4, further comprising lateral deep trench isolation regions, wherein the at least three alternate layers of at least two materials comprising silicon dioxide and the lateral deep trench isolation regions have the same depth and the same structure.

6. A method for fabricating an integrated circuit, the method comprising:
    forming an array of single-photon-avalanche diodes within a semiconductor substrate, the array including first and second diodes, wherein forming the array of single-photon-avalanche diodes comprises forming a bottom insulating region in the substrate, the bottom insulating region defining a bottom of each diode and electrically insulating each diode from the rest of the substrate; and
    forming a Bragg mirror between the first and second diodes, the Bragg mirror configured to prevent a propagation of light between the first and second diodes, wherein each Bragg mirror (MB) comprises at least three alternate layers of at least two materials of different refractive indices, at least two of the layers extending depthwise into the substrate (SBT) from a front side down to the bottom insulating region, and wherein at least one of the layers extends depthwise from the front side down to a far end located between the front side and the bottom insulating region.

7. The method according to claim 6, wherein the Bragg mirror is formed so as to reflect light having a wavelength among the wavelengths capable of being generated by an energetic relaxation of hot carriers generated by an avalanche effect triggered in the first or second diodes.

8. The method according to claim 6, wherein the Bragg mirror is formed so as to reflect light having an angle of incidence comprised between 0° and 90° on the Bragg mirror relative to an axis orthogonal to a main surface of the Bragg mirror.

9. The method according to claim 6, wherein forming the Bragg mirror comprises forming at least three alternate layers of at least two materials of different refractive indices between the first and second diodes.

10. The method according to claim 6, wherein forming the Bragg mirror comprises:
    forming an initial volume of a first material between the first and second diodes, the first material having a first refractive index;
    etching a trench into this first material, the trench having lateral edges delineated by the first material; and
    forming alternating layers of a second material and the first material successively from the lateral edges of the trench until the trench is filled, the second material having a second refractive index different from the first refractive index.

11. The method according to claim 10, wherein the first material is one of silicon or silicon dioxide and the second material the other of silicon or silicon dioxide.

12. The method according to claim 6, wherein forming the Bragg mirror comprises:
   forming an initial volume of a first material between the first and second diodes, the first material having a first refractive index;
   etching a plurality of trenches into the volume of the first material; and
   filling each trench with a second material having a second refractive index different from the first refractive index in order to form layers of second material, each volume of first material located between two layers of second material forming a layer of first material.

13. The method according to claim 12,
   wherein at least one of the trenches filled with second material extends depthwise from the front side down to the far end located between the front side and the bottom insulating region.

14. The method according to claim 13, wherein the first material is one of silicon or silicon diode and the second material the other of silicon or silicon dioxide, the method further comprising forming lateral deep trench isolation regions comprising silicon dioxide, wherein the layers of silicon dioxide are formed simultaneously with the formation of the lateral deep trench isolation regions.

15. A method for fabricating an integrated circuit, the method comprising:
   forming an array of single-photon-avalanche diodes within a semiconductor substrate; and
   forming a plurality of structures, each structure including alternating layers of silicon and silicon dioxide extending into the substrate between adjacent pairs of the diodes, wherein forming the plurality of structures comprises:
      forming a plurality of first trenches in the substrate, each first trench disposed between a respective one of the adjacent pairs of the diodes,
      filling in the plurality of first trenches with a first material, the first material being one of silicon or silicon dioxide,
      etching a respective second trench into the first material of each of the plurality of first trenches so that each respective second trench has lateral edges delineated by the first material, and
      forming alternating layers of a second material and the first material successively from the lateral edges of each respective second trench, the second material being the other one of silicon or silicon dioxide.

16. The method of claim 15, further comprising forming lateral deep trench isolation regions around each pair of the array of single-photon-avalanche diodes.

17. The method according to claim 15, wherein forming the array of single-photon-avalanche diodes comprises forming a bottom insulating region in the substrate, the bottom insulating region defining a bottom of each diode and electrically insulating each diode from the rest of the substrate.

18. A method for fabricating an integrated circuit, the method comprising:
   forming an array of single-photon-avalanche diodes within a semiconductor substrate; and
   forming a plurality of structures, each structure including alternating layers of silicon and silicon dioxide extending into the substrate between adjacent pairs of the diodes, wherein forming the plurality of structures comprises:
      forming a plurality of trenches in the substrate, each trench disposed between a respective one of the adjacent pairs of the diodes;
      filling each trench with a first material, the first material being one of silicon or silicon dioxide;
      for each of the trenches, etching a plurality of smaller trenches into the first material; and
      for each of the trenches, filling each smaller trench with a second material, the second material being the other one of silicon or silicon dioxide.

19. The method of claim 18, further comprising forming lateral deep trench isolation regions around each pair of the array of single-photon-avalanche diodes.

20. The method according to claim 18, wherein forming the array of single-photon-avalanche diodes comprises forming a bottom insulating region in the substrate, the bottom insulating region defining a bottom of each diode and electrically insulating each diode from the rest of the substrate.

* * * * *